US009097776B2

(12) United States Patent
Grodzki

(10) Patent No.: US 9,097,776 B2
(45) Date of Patent: Aug. 4, 2015

(54) MAGNETIC RESONANCE METHOD AND SYSTEM TO AUTOMATICALLY GENERATE A SELECTIVE MR IMAGE

(75) Inventor: David Grodzki, Hannover (DE)

(73) Assignee: Siemens Aktiengesellschaft, Munich (DE)

( * ) Notice: Subject to any disclaimer, the term of this patent is extended or adjusted under 35 U.S.C. 154(b) by 113 days.

(21) Appl. No.: 13/246,019

(22) Filed: Sep. 27, 2011

(65) Prior Publication Data

US 2012/0076384 A1   Mar. 29, 2012

(30) Foreign Application Priority Data

Sep. 27, 2010   (DE) .......................... 10 2010 041 450

(51) Int. Cl.
*G06K 9/00* (2006.01)
*G01R 33/48* (2006.01)

(52) U.S. Cl.
CPC ........ *G01R 33/4816* (2013.01); *G01R 33/4828* (2013.01); *G01R 33/4824* (2013.01)

(58) Field of Classification Search
USPC ........................................................ 382/131
See application file for complete search history.

(56) References Cited

U.S. PATENT DOCUMENTS

| 6,498,486 | B1 | 12/2002 | Ookawa | |
|---|---|---|---|---|
| 6,603,989 | B1 * | 8/2003 | Yablonskiy | 600/410 |
| 7,728,588 | B2 * | 6/2010 | Feiweier | 324/309 |
| 8,148,979 | B1 * | 4/2012 | Du | 324/307 |
| 2005/0110489 | A1 | 5/2005 | Miyoshi | |
| 2006/0164084 | A1 * | 7/2006 | Lomnes | 324/307 |
| 2007/0255129 | A1 * | 11/2007 | Du et al. | 600/410 |
| 2009/0253983 | A1 * | 10/2009 | Foo et al. | 600/420 |
| 2010/0253336 | A1 * | 10/2010 | Schneider et al. | 324/309 |
| 2010/0296714 | A1 * | 11/2010 | Schmainda et al. | 382/131 |
| 2011/0018537 | A1 * | 1/2011 | Warntjes | 324/309 |
| 2011/0044524 | A1 * | 2/2011 | Wang et al. | 382/131 |

OTHER PUBLICATIONS

"3D Radial Projection Technique With Ultrashorl Echo Times for Sodium MRI: Clinical Applications in Human Brain and Skeletal Muscle," Nielles-Vallespin et al., Magnetic Response in Medicine, vol. 57 (2007) pp. 74-83.
"Rapid Single Point (RASP) Imaging," Heid et al., SMR, $3^{rd}$ Annual Meeting (1995) p. 684).
"Imaging Ultra-short $T_2$ Species in the Brain," Nayak et al., Proc. Intl. Soc. Mag, Reson. Med., vol. 8, (2010) p. 209.
Magnetic Resonance Imaging of Short $T_2$ Components in Tissue, Gatehouse et al., Clinical radiology, vol. 58 (2003) pp. 1-19.

\* cited by examiner

*Primary Examiner* — Matthew Bella
*Assistant Examiner* — Weiwen Yang
(74) *Attorney, Agent, or Firm* — Schiff Hardin LLP

(57) ABSTRACT

In a magnetic resonance method and system for automatic generation of a selective MR image from a first MR image (corresponding to raw data acquired at a first echo time after excitation pulses) and a second MR image (corresponding to raw data acquired at a second echo time after the same excitation pulses), wherein at least one raw data measurement point was measured in the absence of gradient fields, a time constant prevailing in the depicted imaging space is calculated from the measurement data measured during readout of the raw data measurement point measured in the absence of gradient fields. Weighting factors for the first and/or the second MR image are determined depending on this time constant. The selective MR image is generated by weighting the first and/or second MR image with the calculated weighting factors and subtraction of the weighted MR images from one another.

11 Claims, 5 Drawing Sheets

MAGNETIC RESONANCE METHOD AND SYSTEM TO AUTOMATICALLY GENERATE A SELECTIVE MR IMAGE

RELATED APPLICATIONS

The present application is related to two applications filed on the same date herewith, now issued as U.S Pat. No. 8,873,820 and entitled "Magnetic Resonance System and Method to Automatically Generate a Selective MR Image (Grodzki), and U.S. Pat. No. 8,878,533 and entitled "Magnetic Resonance System and Method to Automatically Generate a Selective MR Image" (Grodzki et al.).

BACKGROUND OF THE INVENTION

1. Field of the Invention

The invention concerns a method to automatically generate a selective MR image as well as a correspondingly designed magnetic resonance system, a corresponding computer program product and a corresponding electronically readable data medium.

2. Description of the Prior Art

Imaging by means of nuclear magnetic resonance, i.e. magnetic resonance tomography or MR tomography, has found an ever broader field of application in medical diagnostics.

Magnetic resonance technology (in the following the abbreviation MR stands for magnetic resonance) is a known technique with which images of the inside of an examination subject can be generated. In simplified form, the examination subject is positioned in a comparably strong, static, homogeneous basic magnetic field (field strengths of 0.2 Tesla to 7 Tesla or more) in an MR apparatus so that nuclear spins in the subject orient along the basic magnetic field. For spatial coding of the measurement data, rapidly switched gradient fields are superimposed on the basic magnetic field.

To trigger nuclear magnetic resonance signals, radio-frequency excitation pulses are radiated into the examination subject, the triggered nuclear magnetic resonance signals are measured and are stored as raw data in k-space, on the basis of which raw data MR images are reconstructed. MR imaging enables image contrasts that result from the combination of multiple parameters. Important MR parameters are, for example, the density of the excited nuclear spins (primarily hydrogen protons), the relaxation times for magnetizations (T1, T2, T2*) of the examined tissue, the magnetization transfer, and diverse other contrast mechanisms.

Magnetic resonance tomography lends itself to new fields of use through the acquisition of MR data with very short echo times TE (for example TE<500 µs), wherein the echo time corresponds to the time period between the excitation of the nuclear spins and the measurement of the nuclear magnetic resonance that is thus triggered. It is thereby possible to show substances or tissue that cannot be depicted by means of conventional sequences for example a (T)SE ("(Turbo) Spin Echo") sequence or a GRE ("Gradient Echo") sequence, since their T2 time (the relaxation of the transverse magnetization of the substance or tissue) is markedly shorter than the echo time, and thus a corresponding signal from these substances or tissues has already decayed at the point in time of acquisition. With echo times that lie in the range of the corresponding decay time, it is possible, for example, to show bones, teeth or ice in an MR image even though the T2 time of these objects lies in a range from 30-80 µs.

According to the prior art, sequences are known that enable a very short echo time. One example is the radial UTE ("Ultrashort Echo Time") sequence as described in, for example, the article by Sonia Nielles-Vallespin "3D radial projection technique with ultrashort echo times for sodium MRI: Clinical applications in human brain and skeletal muscle", Magn. Res. Med. 2007; 57; P. 74-81. In this sequence type the gradients are ramped up after a wait time T_delay after a non-selective or slice-selective excitation, and the data acquisition is begun at the same time. The k-space trajectory scanned in such a manner after an excitation proceeds radially outwardly from the k-space center. Therefore, before the reconstruction (by means of Fourier reconstruction) of the image data from the raw data acquired in k-space, the raw data must first be converted into a Cartesian k-space grid (for example by regridding).

An additional approach in order to enable short echo times is to scan k-space in points with the free induction decay (FID) signal being detected. Such a method is also designated as a single point imaging because essentially only one raw data point in k-space is acquired per RF excitation. One example of such a method for single point imaging is the RASP method ("Rapid Single Point (RASP) Imaging", O. Heid, M. Deimling, SMR, 3rd Annual Meeting, Page 684, 1995). According to the RASP method, one raw data point in k-space, the phase of which was coded by gradients, is read out at a fixed point in time after the RF excitation at the "echo time" TE. The gradients are modified by means of the magnetic resonance system for each raw data point or measurement point, and thus k-space is scanned (filled) point by point as is shown in FIGS. 1a and 1b.

There are many applications of magnetic resonance tomography in which it is desired to differentiate different tissue types.

For example, in the case of tissue types with different chemical shifts, a different magnetic field results at the nucleus, which leads to different resonance frequencies. In the signal acquisition this leads to different phase angles of the two components. The most prominent representatives of two different tissue types in the magnetic resonance signal are fat and water, but other applications are also possible. The resonance frequencies of fat and water differ by approximately 3.3 ppm (parts per million). One method for separation of the signals of two different tissue types (for example fat and water) is the utilization of the phase information of acquired MR signals.

Furthermore, there is the possibility to differentiate various tissue types based on their different time constants, for example T2 or T2*. For this purpose, it is known to acquire two MR images such that the first MR image corresponds to raw data which were acquired at a first echo time TE1 after the at least one excitation pulse of the imaging sequence and that the second MR image corresponds to raw data which were acquired at a second echo time TE2 (with TE1≠TE2, for example TE1<TE2) after the same excitation pulse or, respectively, the same excitation pulses of the imaging sequence. Each of the MR images includes signals of tissues with a time constant of the decay of the transversal magnetization (T2) for which it applies: T2 (tissue)≥TEi (i=1 or 2).

Two MR images are thus acquired, wherein the MR image that corresponds to raw data which were acquired at the echo time TE1 (given TE1<TE2) can include signals of more tissues than the MR image that corresponds to raw data which were acquired at the echo time TE2 (since TE1<TE2≤T2 (tissue)). For example, by pixel-by-pixel subtraction of the two MR images from one another, the tissue that is contained only in the MR image with the shorter echo time can be shown separately or masked out, and thus the tissue types can be selectively displayed.

However, it should to be noted that the two MR images have different intensities (signal strengths) due to the different echo times, depending on the T2 values of the imaged tissue. Therefore, before a subtraction of the MR images from one another, it is necessary to compensate for these intensity differences (for example by weighting factors) in order to be able to actually erase the signals of the unwanted tissue.

SUMMARY OF THE INVENTION

An object of the present invention is to design the generation of an MR image showing selective tissue types from two respective MR images (corresponding to raw data acquired at different echo times after an excitation pulse) so as to be faster and more reliable than by using conventional techniques.

According to the present invention, a method for automatic generation of a selective MR image from a first MR image (corresponding to raw data acquired at a first echo time after excitation pulses) and a second MR image (corresponding to raw data acquired at a second echo time after the same excitation pulses), wherein at least one raw data measurement point was measured in the absence of gradient fields, proceeds as follows.

A time constant prevailing in the depicted imaging space is calculated from the measurement data that were measured during the readout of the raw data measurement point measured in the absence of gradient fields.

Weighting factors for the first and/or the second MR image are determined depending on the calculated prevailing time constant.

The selective MR image is generated by processing the first and second MR image and the weighting factors with weighting of the first and/or second MR image with the correspondingly calculated weighting factors, and subtraction of the weighted MR images from one another.

The method according to the invention thus allows a selective MR image to be created quickly and with certainty from the data of two acquired MR images, without involvement of a user. By the determination of the time constants from measurement data that were measured in the acquisition of the k-space center (in the absence of gradient fields), a global time constant is determined that—relative to selective MR images calculated on the basis of the individual image points of two MR images—has the advantage that fluctuations from image point to image point in the MR images have a smaller influence on the selective MR image since they do not enter into the determination of the time constants. Transitions between tissues with markedly different time constants can therefore be presented better in the selective MR image.

In an exemplary embodiment, the raw data corresponding to the first MR image are hereby acquired at an echo time TE1 after the excitation pulses which is not longer than a time constant of a tissue to be selectively presented. It is thereby ensured that the tissue to be selectively presented (among other things) is at least visible in the first MR image. The measurement data from which the time constant is calculated are likewise advantageously calculated from such raw data of measurement data to be associated. This means that the prevailing time constant is calculated from measurement data which are to be associated with those raw data which were acquired in a time period after an excitation pulse which is adapted to a time constant of the decay of the transversal magnetization of the tissue to be selectively presented, such that the tissue to be selectively presented is clearly visible in the MR image reconstructed from the raw data.

In an embodiment the raw data corresponding to the first and second MR image are read out as follows:

(a) switch at least two phase coding gradients (Gx, Gy, Gz) in a respective spatial direction by means of a gradient system of the magnetic resonance system, (b) after reaching the full strength of the switched phase coding gradients, radiate a non-slice-selective RF excitation pulse by means of an RF transmission/reception device of the magnetic resonance system, (c) after a time TE1 after the last radiated excitation pulse, acquire echo signals by means of the RF transmission/reception device and store these as raw data points along the radial k-space trajectory predetermined by the strength of the phase coding gradients, (d) repeat (a) through (c) with different phase coding gradients until k-space corresponding to the imaging area is read out in a first region along radial k-space trajectories, depending on the time TE1, and (e) read out a remainder of k-space corresponding to the imaging area, this remainder not covered (filled) by the first region of k-space and including at least the k-space center, in a different manner than by (a) through (d), and store these raw data points.

By switching (activating) the phase coding gradients and waiting until the switched phase coding gradients have reached their full strength before beginning with the RF transmission and the acquisition of echo signals (thus with the acquisition of measurement data), the echo time—thus the time that extends between the excitation by an RF excitation pulse and the start of the acquisition of the measurement data—can be reduced (for example in comparison to a UTE sequence) in the entirety of radial k-space to be scanned. Echo signals of substances with very short T2 can therefore also be acquired, and the repetition time—the time between two RF excitation pulses—can also be correspondingly reduced. Moreover, the measurement is less prone to interference (for example eddy currents induced in the gradient system during the changing of its current feed) since nothing is measured during the ramping up of the phase coding gradients. Measurement data can therefore be acquired with more precision.

The present invention also encompasses a magnetic resonance system that is designed to implement the above-described method in any or all embodiments, as well as a non-transitory, computer-readable storage medium encoded with programming instructions that, when the storage medium is loaded into a computerized control and evaluation system of a magnetic resonance system, cause the magnetic resonance system to implement the method described above, in any and all embodiments.

DESCRIPTION OF THE PREFERRED EMBODIMENTS

Figure 1:
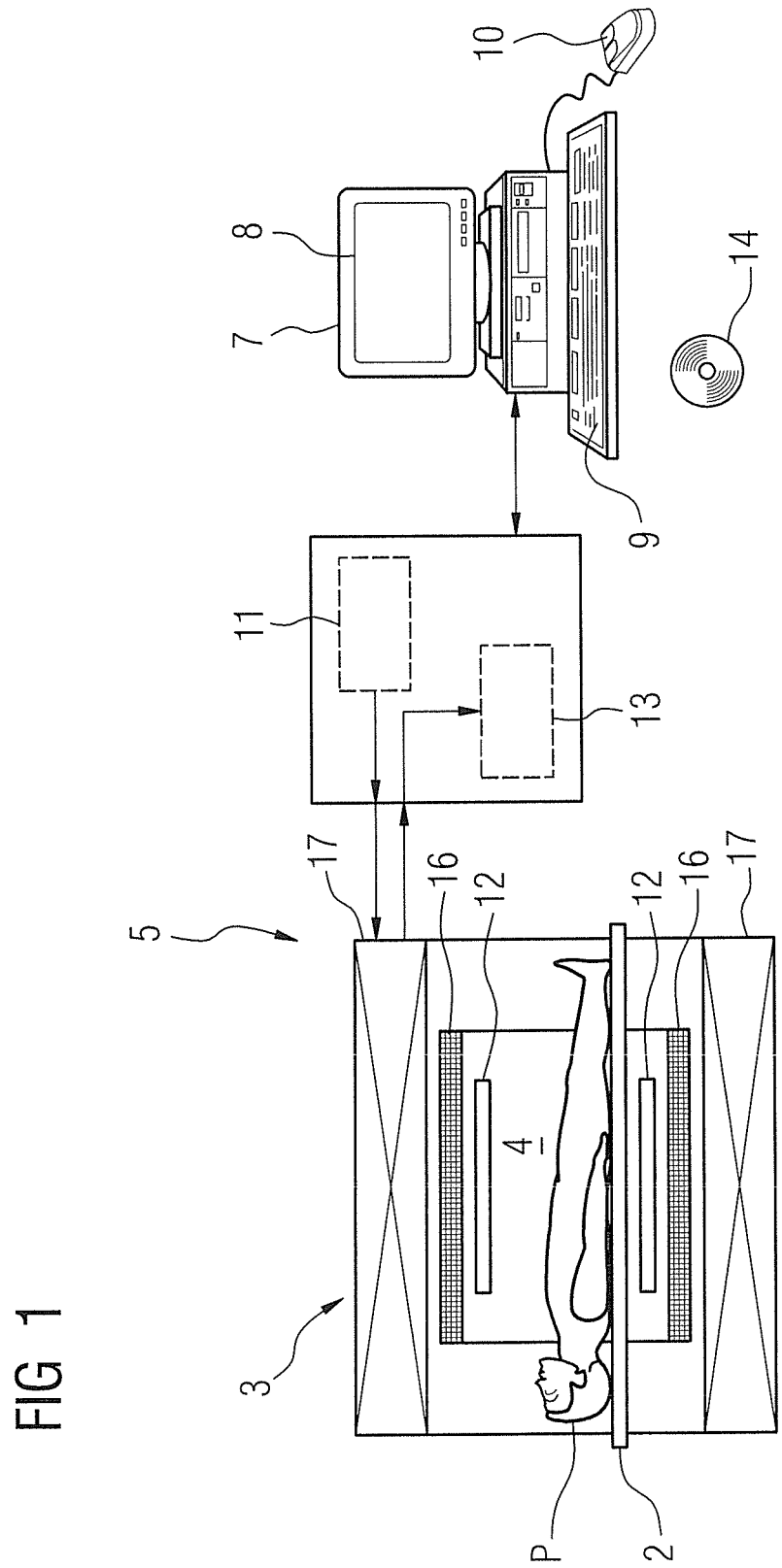
FIG. 1 schematically illustrates a magnetic resonance system according to the invention.

A magnetic resonance system 5 according to the invention is schematically shown in FIG. 1. The magnetic resonance system 5 has a scanner (data acquisition unit) 3 with a basic field magnet unit 17, a gradient system 16 with which the magnetic fields necessary for the MR examination, including gradient fields, are generated in a measurement space 4, a transmission/reception device 12 to transmit RF excitation pulses and receive echo signals, a patient table 2, a control device 6 with which the scanner 3 is operated and raw data are received from the scanner 3, and a terminal 7 connected to the control device 6.

The control device 6 includes an activation unit 11 and an evaluation device 13. During the generation of an image data set, echo signals are acquired by the transmission/reception device 12 by means of the scanner 3, wherein the scanner 3 and the table 2 are activated by the activation unit 11 such that MR data are acquired in an imaging area which is located inside the body of a patient P lying on the table 2.

The evaluation device 13 receives the acquired echo signals as raw data and stores and processes these. For example, the evaluation device 13 processes the read-out raw data using a reconstruction algorithm such that they can be graphically presented on a presentation device 8 (on a monitor 8, for example) of the terminal 7. In particular, multiple MR images can be processed with one another, and such that images generated according to the invention are displayed. In addition to the graphical presentation of the image data reconstructed from the raw data, with the terminal 7 (which in addition to the monitor 8 has an input device, for example a keyboard 9 and/or a computer mouse 10) a three-dimensional volume segment to be measured can be predetermined as an imaging area by a user, for example, and additional parameters can be defined for implementation of the method according to the invention.

The software for the control device 6 can also be loaded into said control device 6 via the terminal 7. This software of the control device 6 can implement any of the embodiments according to the invention. It is thereby also possible for software that runs in the terminal 7 to implement the embodiments. Independently of where the software according to the invention is located, the software can be stored on an electronically readable data medium (a DVD 14, for example) so that this software can then be read from the DVD 14 by the terminal 7 and be copied either into the control device 6 or into a computer of the terminal 7 itself.

Figure 2:
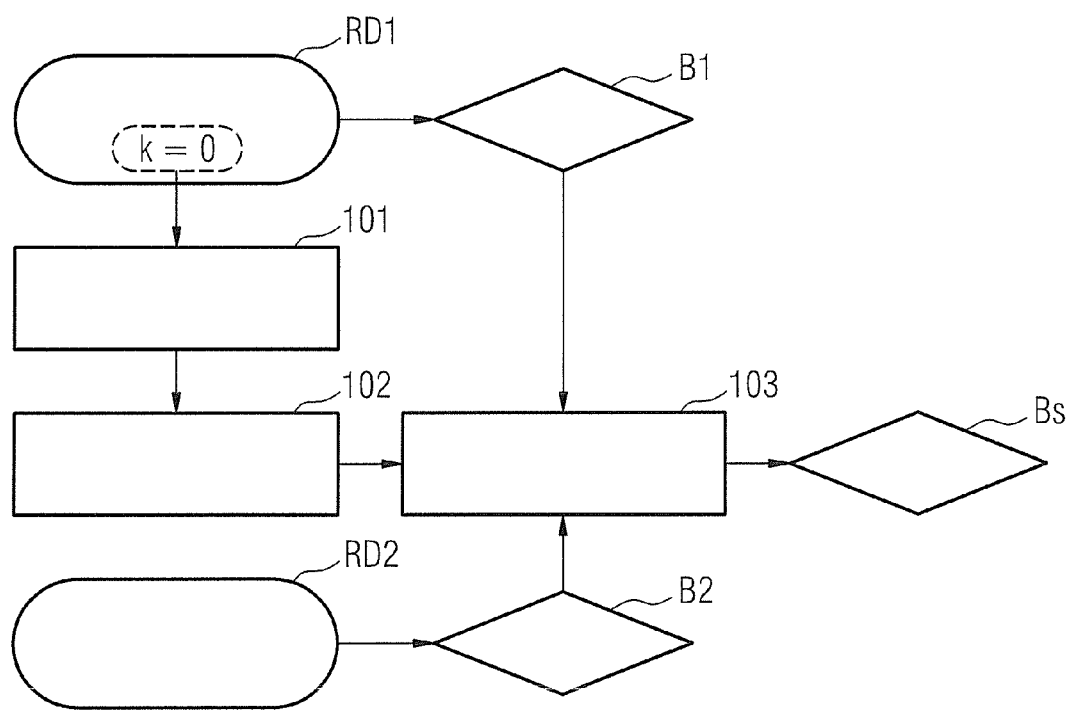
FIG. 2 is a flowchart of an embodiment of the method according to the invention to create a selective MR image.

FIG. 2 schematically shows a flowchart of an embodiment of the method to automatically generate a selective MR image. For this purpose a first MR image B1 (that corresponds to raw data RD1 acquired at a first echo time TE1 after excitation pulses of the acquisition sequence) and a second MR image B2 (that corresponds to raw data RD2 acquired at a second echo time TE2 after the same excitation pulses) are loaded for processing into an evaluation device, for example an evaluation device of a magnetic resonance system, in particular the evaluation device of the magnetic resonance system with which the first MR image and second MR image B1 and B2 were acquired. Either or both of the raw data RD1 and RD2 contain data that was read out in the absence of gradient fields. In FIG. 2, this is schematically indicated for a raw data measurement point (k=0) in the raw data RD1, but an analogous raw data measurement point may also exist for the raw data RD2.

The measurement data with regard to k=0 are selected corresponding to those raw data RD1 (or RD2) which were acquired at an echo time TE1 (or TE2) which is adapted to a time constant of the decay of the transverse magnetization of the tissue to be selectively shown. In other words, the measurement data with regard to k=0 are extracted from the measurement data which were used to generate the MR image B2 or B2 in which the tissue to be selectively shown (among other things) is most clearly visible.

In a first Step 101, a time constant prevailing in the depicted imaging space is calculated from the measurement data which were measured during the readout of the raw data measurement point measured in the absence of gradient fields.

For this at least two of the measurement points are loaded which were measured during the readout of the raw data measurement point measured in the absence of gradient fields (thus of the k-space center). For example, this can proceed as explained in FIG. 5.

Figure 5:
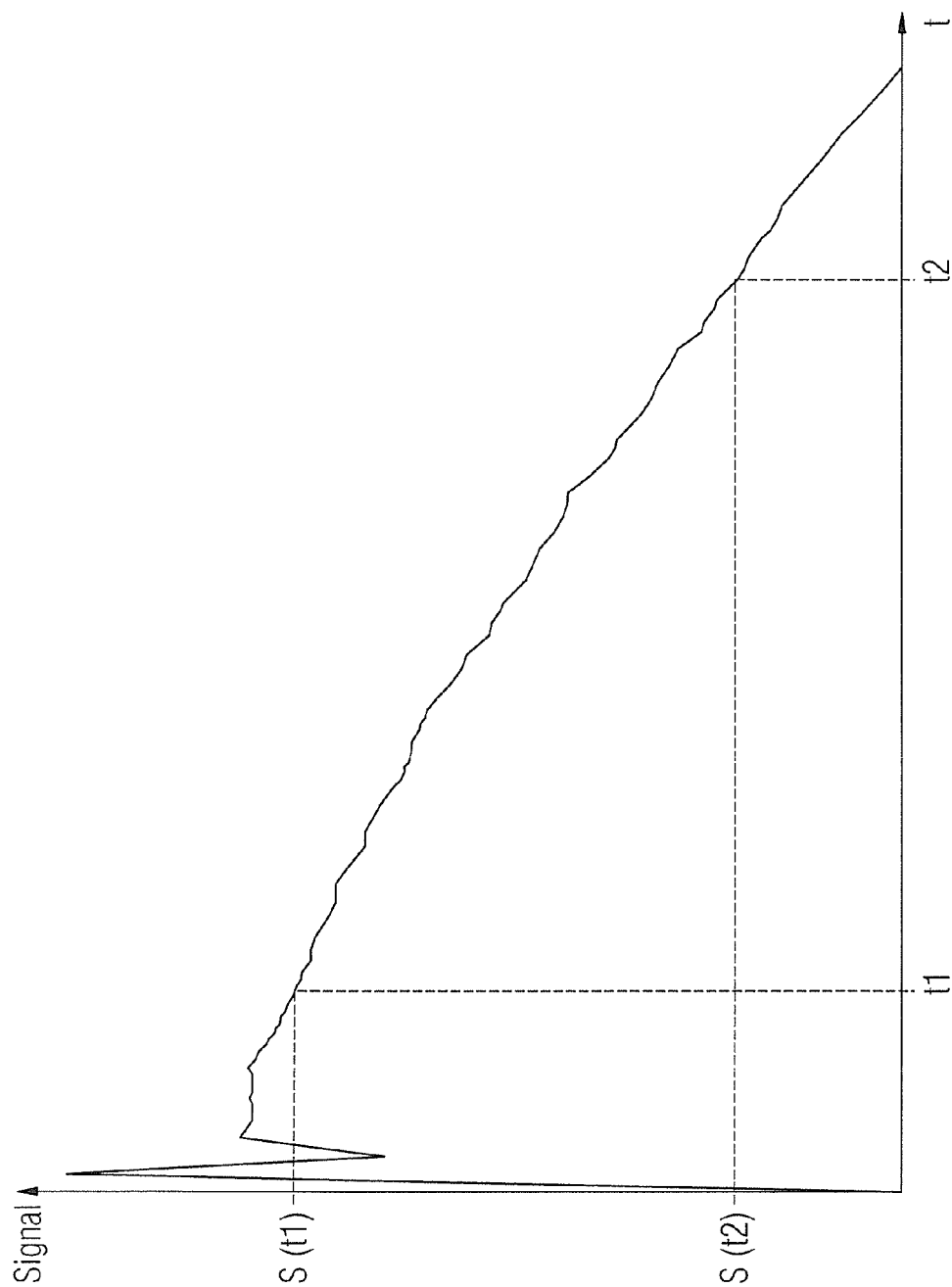
FIG. 5 shows an example of measurement data (signal) measured during the readout of a raw data measurement point measured in the absence of gradient fields, over time t.

In FIG. 5, measurement data (signal) measured during the readout of a raw data measurement point measured in the absence of gradient fields are plotted as an example over the time t (known as the dwell time) at which they were acquired. The signal curve corresponds to an FID ("free induction decay") in the absence of gradient fields. FIG. 5 shows the signal curve of an acquisition channel. If multiple acquisition channels are used, the time constant to be determined can be averaged over all acquisition channels that are used, for example by first determining a time constant for each acquisition channel and then calculating the average of the time constants of the individual acquisition channels, that is emitted as a final, calculated time constant.

In a normal image reconstruction, only one measurement point—for example S(t1)—is used and the remaining values are discarded. However, if at least two of the measured measurement data—for example S(t1) and S(t2)—are taken, the time constant of the decay of the transverse magnetization T2 that prevails in the examined imaging area—thus the time constant defining the decrease of the FID)—can be calculated from these two values. The raw data measurement point that is measured in the absence of gradients lies in the k-space center (k=0, or more precisely $k_x=0$, $k_y=0$, $k_z=0$). This raw data measurement point is decisive for the contrast of the MR image reconstructed from the raw data. Therefore the time constant calculated from the FID of this measurement point corresponds to the tissue predominant in the MR image that is later reconstructed from the raw data.

Calculation of the time constant utilizes the knowledge about the decay of the FID over time (which decay forms the basis of the acquisition of the measurement data) depending on the time constant T2, for which it applies that:

$$S(t)=S0*\exp(-t/T2) \qquad (1);$$

wherein S is the signal intensity at the point in time t, S0 is the signal intensity at the point in time t=0 and the time constant T2 is the time constant of the decay of the transversal magnetization.

Taking two of the measurement points S(t1) and S(t2), the time constant T2 can now be calculated, for example via application in (1) and transformation into:

$$S(t1)/S(t2)=\exp((t2-t1)/T2) \qquad (2);$$

$$<=>T2=(t2-t1)/(\ln(S(t1))-\ln(S(t2))) \qquad (3).$$

The time constant T2 prevailing in the depicted image area is thus obtained.

Which measurement points of the measurement data of the FID are used for the calculation of the time constant is thereby basically arbitrary, but better results are achieved if the two measurement points do not lie directly next to one another, and when the first approximately 6-10 measurement points are not used since these can be overlapped by transient effects of the measurement.

In a further Step 102, weighting factors for the first and/or second MR image are determined depending on the calculated prevailing time constant.

The weighting factors are hereby defined such that they compensate for the intensity differences in the first MR image and second MR image B1 and B2 so that identical tissue in the two MR images B1 and B2 are shown identically.

For example, this can occur by the knowledge being based on the decay of the intensity of the signals in an MR image corresponding to the echo time TE (at which the raw data corresponding to the MR image were acquired) and the time constant T2 of the tissue imaged in the MR image, which time constant T2 decays with a factor A=exp(−TE/T2). The signal decay of the MR images B1 and B2 corresponding to the raw data acquired at different echo times TE1 and TE2 can thus be compensated in a simple manner in that the factor of the signal decay is neutralized. For example, the following weighting factors thus result:

For the first MR image B1:

$$\text{Weighting factor } a = \exp(TE1/T2) \quad (4),$$

it then applies that $$a*A(B1) = \exp(TE1/T2)*\exp(-TE1/T2) = 1.$$

For the second MR image B2:

$$\text{Weighting factor } b = \exp(TE2/T2) \quad (5),$$

it then applies that $$b*A(B2) = \exp(TE2/T2)*\exp(-TE2/T2) = 1.$$

However, it is also possible to calculate only one weighting factor for one of the two MR images B1 and B2 that is taken into account in both MR images B1 and B2 in spite of the signal decay. For example, for this a $$\text{weighting factor } f = \exp((TE2-TE1)/T2) = b/a \quad (6)$$

can be calculated for the second MR image B2, which—as is later clarified with regard to Formula (9), for example—likewise compensates for the differences in the signal intensity of the MR images B1 and B2. Analogously, a $$\text{weighting factor } g = \exp((TE1-TE2)/T2) = a/b \quad (7)$$

could also be calculated for the first MR image B1 that serves the same purpose (see Formula (10)).

In a further Step 103, a selective MR image Bs is created via a processing of the first and second MR image B1 and B2 and the weighting factors a, b or f or g, comprising a weighting of the first and/or second MR image B1, B2 with the correspondingly calculated weighting factors a, b or f or g and subtraction of the weighted MR images B1, B2 from one another.

For example, this can occur according to one of the following formulas:

$$Bs = a*B1 - b*B2 \quad (8)$$

or, analogously, $$Bs' = B1 - f*B2 \quad (8) \text{ [sic]},$$

with $Bs' = Bs/a$ and $f = b/a$ or $$Bs'' = g*B1 - B2 \quad (10),$$

with $Bs'' = Bs/b$ and $g = a/b$.

A selective MR image Bs, Bs', Bs" is thus obtained via multiplication of the respective weighting factors at the corresponding first and/or second MR image B1, B2 and subtraction of the second MR image so weighted from the first MR image so weighted.

Figure 3:
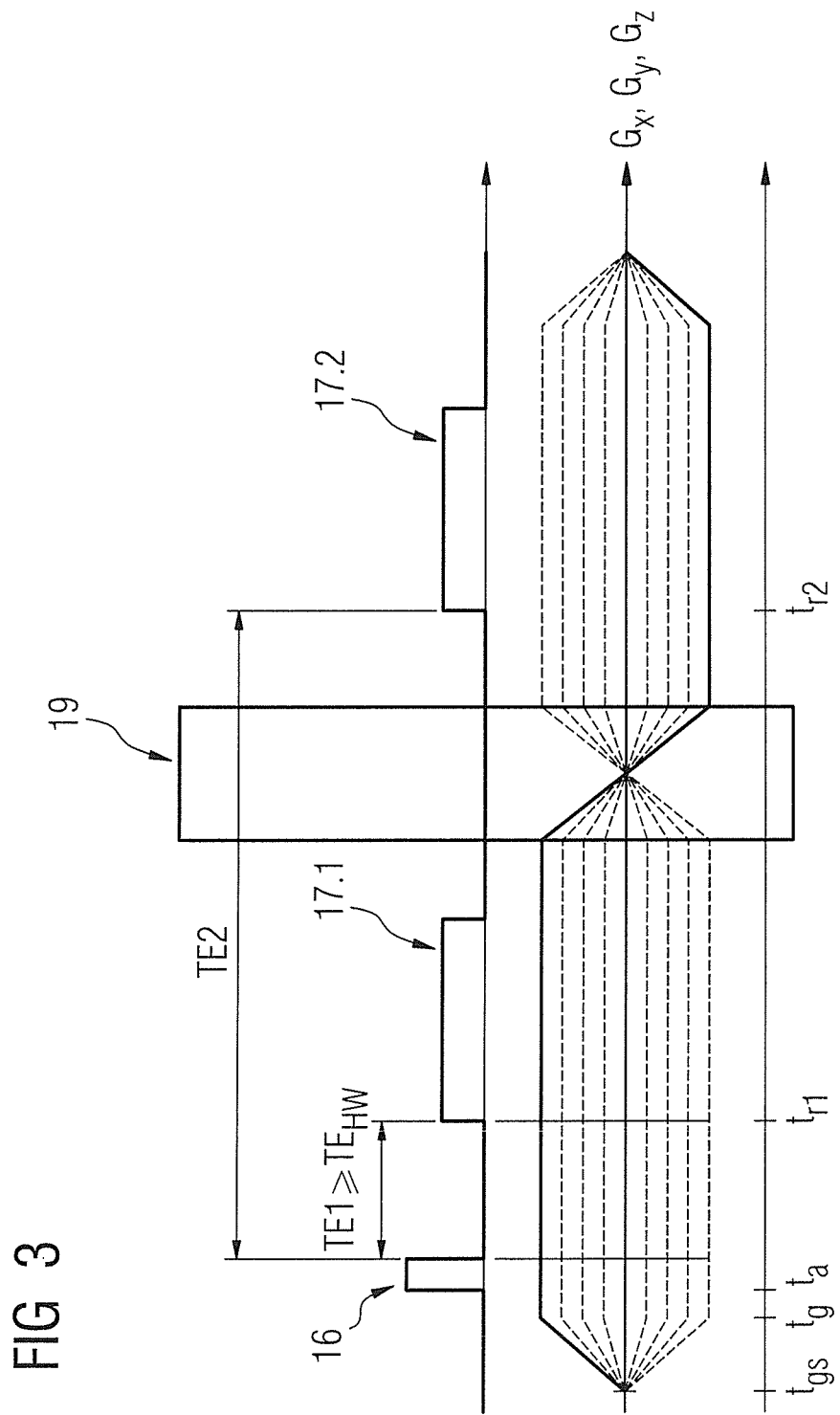
FIG. 3 schematically illustrates a portion of a sequence to acquire multiple raw data points on a radial k-space trajectory with which raw data can be acquired for a first MR image and a second MR image.

The portion of a sequence to be applied in an exemplary embodiment that serves for the acquisition of multiple raw data points on a radial k-space trajectory (wherein short echo times of at least TE1 can especially be achieved) is schematically depicted in FIG. 3. At least two phase coding gradients $G_x$, $G_y$, $G_z$ are thereby switched by means of a gradient system of a magnetic resonance system at a point in time $t_{gs}$ and reach their full strength at a point in time $t_g$. A non-slice-selective RF excitation pulse 16 is radiated by means of an RF transmission-reception device of the magnetic resonance system at a later point in time $t_a > t_g$. After an echo time TE1 after the RF excitation pulse 16 (that advantageously corresponds to the hardware-dependent minimum switch-over time between a transmission mode and a reception mode of an RF transmission-reception device $TE_{HW}$ that is used), the readout time period 17.1 for readout of the echo signals as raw data along the radial k-space trajectory predetermined by the strength of the phase coding gradient (which radial k-space trajectory forms the basis of the first MR image B1) is begun at a point in time $t_{r1}$. After a refocusing measure 19—for example an inversion of the gradient—and after an echo time TE2 after the RF excitation pulse 16, at the point in time $t_{r2}$ the readout time period 17.2 for reading out the echo signals as raw data along the radial k-space trajectory predetermined by the strength of the phase coding gradient (which radial k-space trajectory forms the basis of the second MR image B2) is begun at a point in time $t_{r2}$.

If the shown portion of the sequence is repeated with different phase coding gradients, a large portion of k-space can be read out quickly in a first region along radial k-space trajectories, which first region is dependent on the time TE1. However, the k-space center cannot be read out in this manner since the echo time TE1 is limited at the low end by the hardware-dependent time $TE_{HW}$ and the strength of the phase coding gradient is not equal to "zero". However, the k-space center can be read out at every point in time between the imaged portions of the sequence, or at the beginning or the end of the sequence, by means of an arbitrary known acquisition technique that allows echo times corresponding to the echo times presented above.

Figure 4:
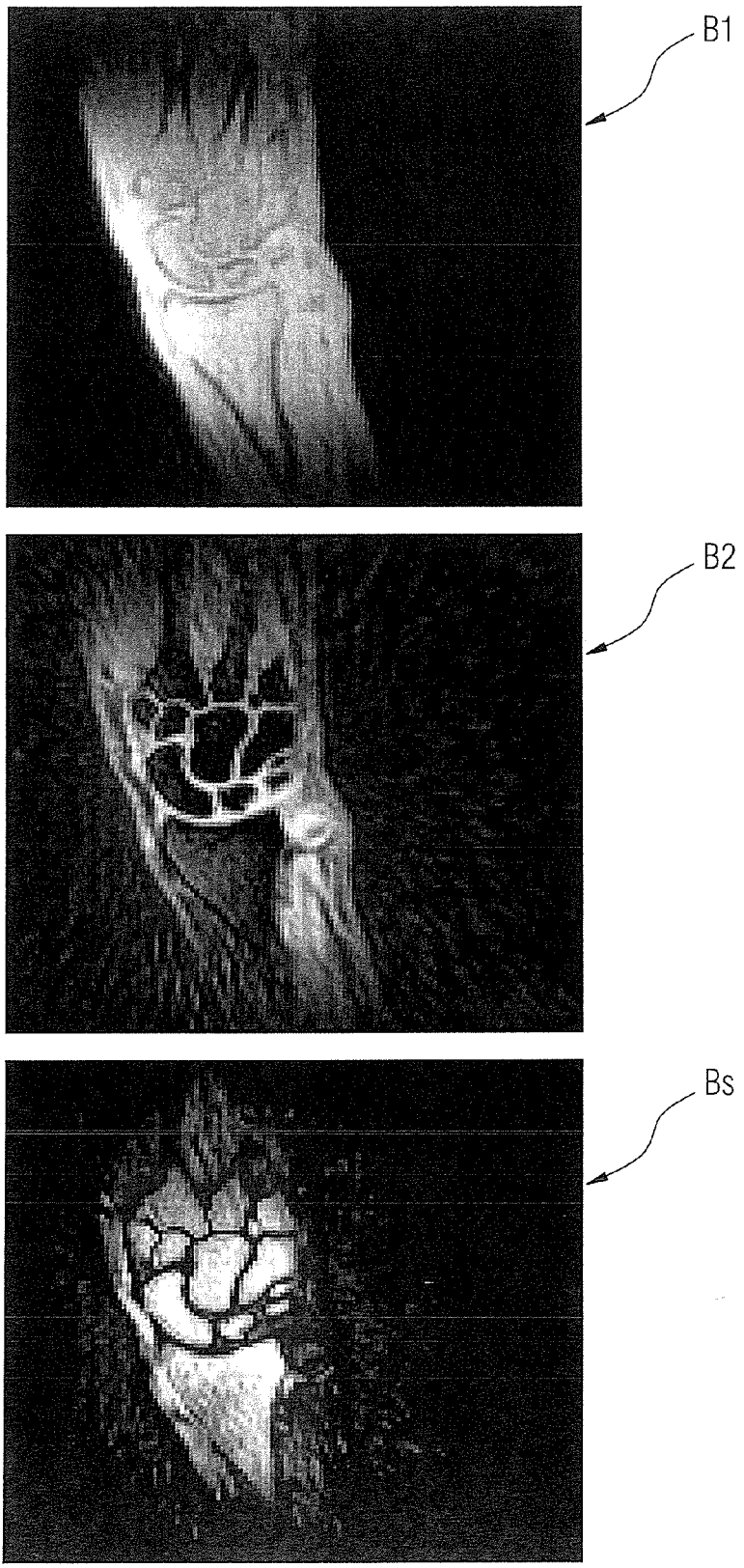
FIG. 4 shows examples of a first and second MR image B1 and B2 with an associated selective MR image Bs.

FIG. 4 shows as an example a first MR image B1, an associated MR image B2 and an associated selective MR image Bs created according to the invention.

The shown MR images B1 and B2 are coronal exposures of a wrist of a patient with a resolution of 150/128 mm that were measured with a repetition time TR=10 ms and a total acquisition duration of 50 s. The first MR image B1 represents raw data acquired at a first echo time TE1=50 µs. At the first echo time TE1, signals of bones and ligaments have not yet decayed and these tissues are therefore clearly recognizable in the first MR image B1 in addition to tissues with longer T2 (muscle tissue, for example). The second MR image B2 represents raw data acquired at a second echo time TE2=2280 µs. The signals of bones and ligaments have already decayed at the second echo time TE2 since their time constants of the decay of the transversal magnetization T2 are on the order of approximately 100 µs. Therefore neither bones nor ligaments are recognizable in the second MR image B2.

The selective MR image Bs shown in FIG. 4 was created automatically with the method described above, wherein a time constant prevailing in the MR image was determined using the FID of the signal acquired at the k-space center, and from this the factors a and b were calculated with which the selective MR image Bs was created.

As is apparent, only the tissue predominant in the first MR image (bone, in this case) is thus displayed in the selective MR image Bs and can thus be examined in more detail by a diagnostic observer.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a selective magnetic resonance (MR) image, comprising:
    operating an MR data acquisition unit, comprising a radio-frequency (RF) transmission/reception system and a gradient coil system, with a subject situated in said MR data acquisition unit, to radiate an RF excitation pulse, via said RF transmission/reception system, that places nuclear spins in tissue in the examination subject in an excited state and thereby causes the nuclear spins in said excited state to emit an MR signal as said nuclear spins relax from said excited state, thereby causing said MR signal to exhibit an amplitude decay;
    operating said MR data acquisition unit with said subject therein, after a first echo time of said MR signal, to acquire a first set of raw data, in a first detection window, representing said MR signal at a plurality of points in time in said first detection window, during selected activation of gradient fields with said gradient coil system, and entering said first set of raw data at respective data entry points in a memory organized as first k-space matrix, having matrix axes defined by said gradient fields, said respective points in said matrix having coordinates defined by said axes of said first k-space matrix, said first set of raw data acquired during said first detection window representing a first MR image with said tissue being represented therein as intensity values associated with a time constant that prevails globally in said first MR image due to the amplitude decay of said MR signal during said first detection window;
    operating said MR data acquisition unit, with said subject therein, after a second echo time of said MR signal that extends beyond an end of said first detection window, to acquire a second set of raw data in a second detection window representing said MR signal at a plurality of points in time during said second detection window, with selected activation of gradient fields with said gradient coil system, and entering said second set of raw data at respective data entry points in a memory organized as second k-space matrix, having matrix axes defined by said gradient fields, said respective points in said matrix having coordinates defined by said axes of said second k-space matrix, said raw data acquired during said second detection window representing a second MR image with said tissue represented therein as intensity values associated with a time constant that prevails globally in said second MR image due to the amplitude decay of said MR signal during said second detection window;
    operating said MR data acquisition unit to implement said selected activation of said gradient fields during said first and second detection windows to cause at least one of (a) data in said first data set to be entered in said first k-space matrix at a data entry point that is a center of said first k-space matrix by virtue of having coordinate values of zero on all of said axes of said first k-space matrix, and (b) data in said second data set to be entered in said second k-space matrix at a data entry point that is a center of said second k-space matrix by virtue of having coordinate values of zero on all of said axes of said second k-space matrix;
    supplying said raw data representing each of said first MR image and said second MR image to a processor and, in said processor, calculating, for at least one image selected from first and second MR images, the time constant that prevails globally in said at least one image, dependent only on the raw data at said center of said at least one of said first or second k-space matrices;
    in said processor, using the calculated time constant to generate a weighting factor;
    in said processor, generating a selective image as a combination of intensity values in said first MR image and in said second MR image, with the intensity values in at least one of said first MR image and said second MR image being weighted, in said combination, by said weighting factor; and
    making the selective image available at an output of the processor in electronic form.

2. The method as claimed in claim 1 comprising calculating the weighting factor to compensate for a decline in intensity of said tissue in said first and second MR images.

3. The method as claimed in claim 1 comprising calculating said weighting factor dependent on said first and second echo times.

4. The method as claimed in claim 1 comprising acquiring the raw data for said first MR image with an echo time TE1 following each excitation pulse, with TE1 being less than a time constant of said tissue.

5. The method as claimed in claim 4 wherein said time constant of said tissue is a time constant for decay of transverse magnetization.

6. The method as claimed in claim 1 comprising reading out raw data for each of said first MR image and said second MR image by operating said MR data acquisition unit by:
    (a) activating at least two phase coding gradients in respective spatial directions with the gradient system of the data acquisition unit,
    (b) after the activated phase coding gradients achieve a full strength, radiating a non-slice-selective RF excitation pulse with said RF transmission/reception system of the data acquisition unit,
    (c) after a time TE1 following the radiated excitation pulse, acquiring echo signals with said RF transmission/reception system and storing said echo signals as raw data points in k-space along a radial k-space trajectory that is predetermined by a strength of the phase coding gradients,
    (d) repeating (a) through (c) with respectively different phase coding gradients in each repetition until k-space corresponding to the image area is read out in a first region of k-space along radial k-space trajectories, depending on said time TE1, and
    (e) reading out a remainder of k-space that corresponds to the imaging area, said remainder not being filled by said first region and including at least a center of k-space, in a read out procedure that is different from (a) through (d), and storing all data points read out in (d) and (e).

7. The method as claimed in claim 6 wherein said RF transmission/reception system has a minimum switchover time between operation in a transmission mode, in which said RF excitation pulse is radiated, and a reception mode, in which said echo signals are read out, and setting said time TE1 equal to said minimum switchover time.

8. The method as claimed in claim 1 comprising selectively showing tissue selected from the group consisting of bone and ligaments as said tissue.

9. The method as claimed in claim 1 comprising, in said processor, calculating said time constant using only raw data measurement points, among the raw data measurement points for said one of said images, acquired within a time period after said RF excitation pulse that is adapted to a time constant of decay of transverse magnetization of said nuclear spins in said tissue that allows said tissue to be clearly visible in said one of said images.

10. A magnetic resonance (MR) system comprising:
an MR data acquisition unit comprising a radio-frequency (RF) transmission/reception system and a gradient coil system;
a control unit configured to operate an MR data acquisition unit with a subject situated therein, to radiate an RF excitation pulse, via said RF transmission/reception system that places nuclear spins in tissue in the examination subject in an excited state and thereby causes the nuclear spins in said excited state to emit an MR signal as said nuclear spins relax from said excited state, thereby causing said MR signal to exhibit an amplitude decay;
said control unit being configured to operate said MR data acquisition unit with said subject therein, after a first echo time of said MR signal, to acquire raw data, in a first detection window, representing said MR signal at a plurality of points in time in said first detection window, during selected activation of gradient fields with said gradient coil system, and entering said first set of raw data at respective data entry points in a memory organized as first k-space matrix, having matrix axes defined by said gradient fields, said respective points in said matrix having coordinates defined by said axes of said first k-space matrix, said first set of raw data acquired during said first detection window representing a first MR image with said tissue being represented therein as intensity values associated with a time constant that prevails globally in said first MR image due to the amplitude decay of said MR signal during said first detection window;
said control unit being configured to operate said MR data acquisition unit, with said subject therein, after a second echo time of said MR signal that extends beyond an end of said first detection window, to acquire raw data in a second detection window representing said MR signal at a plurality of points in time during said second detection window, with selected activation of gradient fields with said gradient coil system, and entering said second set of raw data at respective data entry points in a memory organized as second k-space matrix, having matrix axes defined by said gradient fields, said respective points in said matrix having coordinates defined by said axes of said second k-space matrix, said second set of raw data acquired during said second detection window representing a second MR image with said tissue represented therein as intensity values associated with a time constant that prevails globally in said second MR image due to the amplitude decay of said MR signal during said second detection window;
said control unit being configured to operate said MR data acquisition unit to implement said selected activation of said gradient fields during said first and second detection windows to cause (a) data in said first data set to be entered in said first k-space matrix at a data entry point that is a center of said first k-space matrix by virtue of having coordinate values of zero on all of said axes of said first k-space matrix, and (b) data in said second data set to be entered in said second k-space matrix at a data entry point that is a center of said second k-space matrix by virtue of having coordinate values of zero on all of said axes of said second k-space matrix;
a processor supplied with said raw data representing each of said first MR image and said second MR image, said processor being configured to calculate, for at least one image selected from first and second MR images, the time constant that prevails globally in said at least one image, dependent only on the raw data at said center of said at least one of said first or second k-space matrices;
said processor being configured to use the calculated time constant to generate a weighting factor;
said processor being configured to generate a selective image as a combination of intensity values in said first MR image and in said second MR image, with the intensity values in at least one of said first MR image and said second MR image being weighted, in said combination, by said weighting factor; and
said processor being configured to make the selective image available at an output of the processor in electronic form.

11. A non-transitory, computer-readable data storage medium encoded with programming instructions, said storage medium being loaded into a computerize control and evaluation system of a magnetic resonance (MR) system having an MR data acquisition unit, said MR data acquisition unit comprising a radio-frequency (RF) transmission/reception system and a gradient coil system, and said programming instructions causing said computerized control and evaluation system to:
operate said MR data acquisition unit with a subject situated therein to radiate an RF excitation pulse, via said RF transmission/reception system, that places nuclear spins in tissue in the examination subject in an excited state and thereby causes the nuclear spins in said excited state to emit an MR signal as said nuclear spins relax from said excited state, thereby causing said MR signal to exhibit an amplitude decay;
operate said MR data acquisition unit with said subject therein, after a first echo time of said MR signal, to acquire a first set of raw data, in a first detection window, representing said MR signal at a plurality of points in time in said first detection window, during selected activation of gradient fields with said gradient coil system, and to enter said first set of raw data at respective data entry points in a memory organized as first k-space matrix, having matrix axes defined by said gradient fields, said respective points in said matrix having coordinates defined by said axes of said first k-space matrix, said first set of raw data acquired during said first detection window representing a first MR image with said tissue being represented therein as intensity values associated with a prevailing time constant that prevails globally in said first MR image due to the amplitude decay of said MR signal during said first detection window;
operate said MR data acquisition unit, with said subject therein, after a second echo time of said MR signal that extends beyond an end of said first detection window, to acquire raw data in a second detection window representing said MR signal at a plurality of points in time during said second detection window, with selected activation of gradient fields with said gradient coil system, and to enter said second set of raw data at respective data entry points in a memory organized as second k-space matrix, having matrix axes defined by said gradient fields, said respective points in said matrix having coordinates defined by said axes of said second k-space matrix, said second set of raw data acquired during said second detection window representing a second MR image with said tissue represented therein as intensity values associated with a time constant that prevails globally in said second MR image due to the amplitude decay of said MR signal during said second detection window;

operate said MR data acquisition unit to implement said selected activation of said gradient fields during said first and second detection windows to cause (a) data in said first data set to be entered in said first k-space matrix at a data entry point that is a center of said first k-space matrix by virtue of having coordinate values of zero on all of said axes of said first k-space matrix, and (b) data in said second data set to be entered in said second k-space matrix at a data entry point that is a center of said second k-space matrix by virtue of having coordinate values of zero on all of said axes of said second k-space matrix;

calculate, for at least one image selected from first and second MR images, the time constant that prevails globally in said at least one image, dependent only on the raw data acquired in the absence of any gradient field in said at least one image at said center of said at least one of said first or second k-space matrices;

use the calculated time constant to generate a weighting factor;

generate a selective image as a combination of intensity values in said first MR image and in said second MR image, with the intensity values in at least one of said first MR image and said second MR image being weighted, in said combination, by said weighting factor; and make the selective image available at an output of the processor in electronic form.

\* \* \* \* \*